(12) United States Patent  
Ables et al.

(10) Patent No.: US 7,867,874 B2
(45) Date of Patent: Jan. 11, 2011

(54) METHOD AND APPARATUS FOR PACKAGING CIRCUIT DEVICES

(75) Inventors: Billy D. Ables, Richardson, TX (US); John C. Ehmke, Dallas, TX (US); Roland W. Gooch, Dallas, TX (US)

(73) Assignee: Raytheon Company, Waltham, MA (US)

( * ) Notice: Subject to any disclaimer, the term of this patent is extended or adjusted under 35 U.S.C. 154(b) by 2 days.

(21) Appl. No.: 12/468,520

(22) Filed: May 19, 2009

(65) Prior Publication Data

US 2009/0227068 A1 Sep. 10, 2009

Related U.S. Application Data

(62) Division of application No. 10/094,174, filed on Mar. 8, 2002, now Pat. No. 7,535,093.

(51) Int. Cl.
 *H01L 21/46* (2006.01)
 *H01L 21/30* (2006.01)
(52) U.S. Cl. .............. 438/456; 257/E21.499; 257/E21.577; 438/106; 438/667; 438/672
(58) Field of Classification Search ......... 257/E21.499, 257/E21.577; 438/106, 456, 667, 672
 See application file for complete search history.

(56) References Cited

U.S. PATENT DOCUMENTS

| 5,502,335 | A | 3/1996 | Oda |
| 6,066,889 | A | 5/2000 | Jones et al. |
| 6,069,407 | A | 5/2000 | Hamzehdoost |
| 6,145,731 | A | 11/2000 | Tower et al. |
| 6,225,694 | B1 | 5/2001 | Terui |
| 6,225,696 | B1 | 5/2001 | Hathaway et al. |
| 6,372,540 | B1 | 4/2002 | Huemoeller |
| 6,376,908 | B1 | 4/2002 | Gaku et al. |
| 6,400,010 | B1 | 6/2002 | Murata |
| 6,404,061 | B1 | 6/2002 | Hikita et al. |
| 6,404,067 | B1 | 6/2002 | Singh et al. |
| 6,410,979 | B2 | 6/2002 | Abe |
| 6,781,231 | B2 * | 8/2004 | Minervini ............... 257/704 |
| 6,806,557 | B2 * | 10/2004 | Ding ................... 257/659 |
| 7,104,129 | B2 * | 9/2006 | Nasiri et al. ........... 73/514.29 |
| 7,166,911 | B2 * | 1/2007 | Karpman et al. ......... 257/711 |
| 7,358,106 | B2 * | 4/2008 | Potter ................... 438/51 |
| 7,647,836 | B2 * | 1/2010 | O'Brien et al. ........... 73/756 |
| 2002/0023765 | A1 | 2/2002 | Sugiura et al. |
| 2002/0038663 | A1 | 4/2002 | Zenko et al. |

* cited by examiner

*Primary Examiner*—Asok K Sarkar
(74) *Attorney, Agent, or Firm*—Baker Botts L.L.P.

(57) ABSTRACT

A hermetically sealed package includes a lid (14) hermetically bonded to a wafer or substrate (12), with a chamber therebetween defined by a recess (16) in the lid. A circuit device (26) such as MEMS device is provided within the chamber on the substrate. A plurality of vias (41-46) are provided through the substrate, and each have a structure which facilitates a hermetic seal of a suitable level between opposite sides of the substrate. The vias provide electrical communication from externally of the assembly to the device disposed in the chamber.

9 Claims, 4 Drawing Sheets

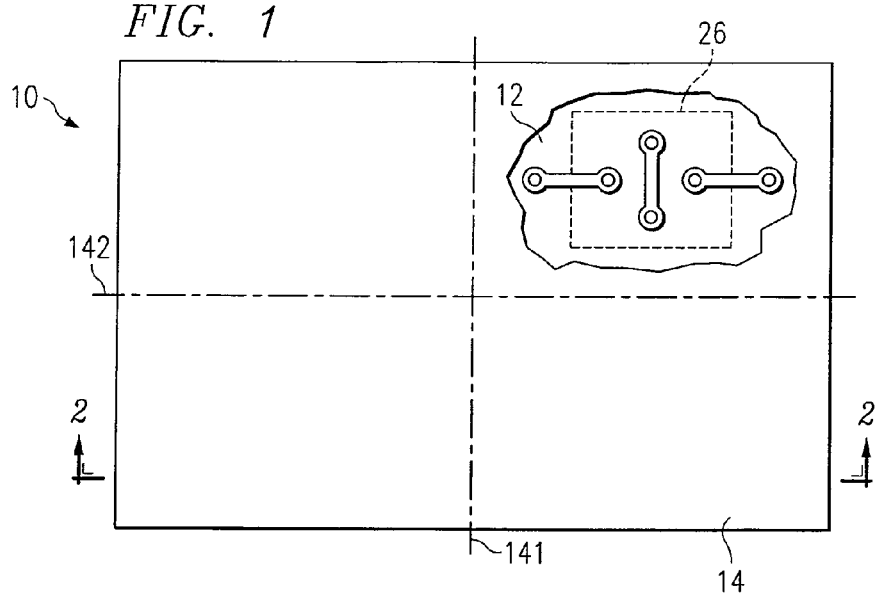
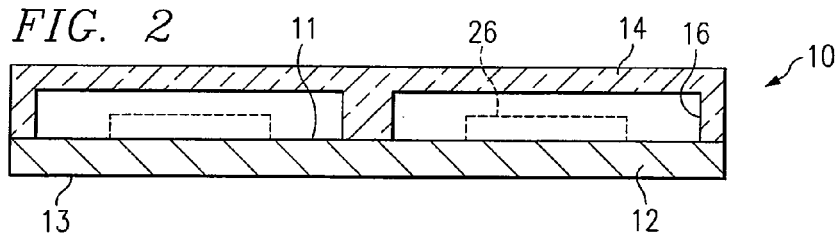
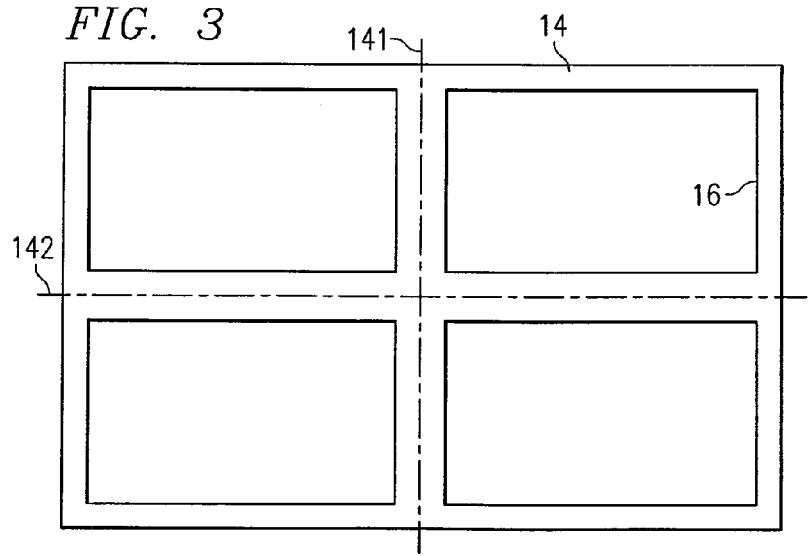

US 7,867,874 B2

METHOD AND APPARATUS FOR PACKAGING CIRCUIT DEVICES

RELATED APPLICATIONS

This application is a divisional of application Ser. No. 10/094,174 filed Mar. 8, 2002, entitled Method and Apparatus for Packaging Circuit Devices.

TECHNICAL FIELD OF THE INVENTION

This invention relates in general to packages for circuit devices and, more particularly, to hermetically sealed packages for high frequency switching devices.

BACKGROUND OF THE INVENTION

In recent years, one rapidly developing area of technology has involved devices commonly known as micro-electro-mechanical-systems (MEMS). One example is a known MEMS device that can effect radio frequency (RF) switching at speeds that may be as high as 45 GHz. In order to facilitate safe operation of these devices, they are normally disposed in a chamber within some form of hermetically sealed package, where the chamber contains either a vacuum or an inert gas. Packages have previously been developed for this purpose, and have been generally adequate for their intended purposes. However, they have not been satisfactory in all respects.

More specifically, existing packages usually impose performance limitations on the inherent capabilities of the MEMS devices, for example due to internal connections and bond wires. Further, electrical connections between the interior and exterior of the package, which are sometimes referred to as "transitions", tend to impose higher than desirable losses on the signals passing through them. Moreover, existing packages are heavier and more expensive than desirable for many applications.

SUMMARY OF THE INVENTION

From the foregoing, it may be appreciated that a need has arisen for a method and apparatus for packaging for certain circuit devices which avoids at least some of the disadvantages of pre-existing packages. According to the present invention, a method and apparatus are provided to address this need.

More specifically, one form of apparatus according to the invention includes: a substrate having first and second sides, and having therethrough an opening which extends from the first side to the second side; a via which is disposed in the opening, which provides a hermetic seal within the opening with respect to opposite sides of the substrate, which has first and second ends respectively adjacent the first and second sides of the substrate, and which includes a conductive portion providing electrical conductivity between the first and second ends thereof; and structure provided on the first side of the substrate and electrically coupled to the conductive portion at the first end of the via.

One form of a method according to the invention includes: providing a wafer having first and second sides and having a plurality of sections which are each an integral part of the wafer, the first side of the wafer having a plurality of first annular surface portions which are each disposed on a respective one of the sections; forming a plurality of spaced structures on the first side of the wafer in a manner so that each of the structures is on a respective one of the sections and so that each of the first annular surface portions extends around a respective one of the structures; providing a cover having on one side thereof a plurality of second annular surface portions which are each engageable with a respective one of the first annular surface portions all along the length thereof; bonding each of the first annular surface portions to a respective one of the second annular surface portions so as to effect a hermetic seal therebetween all along the length of each annular surface portion, the wafer and the cover cooperating to define therebetween a plurality of hermetically sealed chambers which each have therein a respective one of the structures, each of the first annular surface portions extending around a respective one of the chambers; and thereafter cutting the wafer and cover into a plurality of portions which each include a respective section of the wafer, a respective one of the structures, a respective one of the first annular surface portions, and a respective one of the second annular surface portions.

BRIEF DESCRIPTION OF THE DRAWINGS

A better understanding of the present invention will be realized from the detailed description which follows, taken in conjunction with the accompanying drawings, in which:

FIG. 1 is a diagrammatic top view of an assembly which embodies the present invention, with a portion of a lid cut away so that certain internal structure of the assembly is visible;

FIG. 2 is a diagrammatic sectional side view taken along the section line 2-2 in FIG. 1;

FIG. 3 is a diagrammatic bottom view of a lid which is a component of the assembly of FIG. 1;

DETAILED DESCRIPTION OF THE INVENTION

Figure 4:
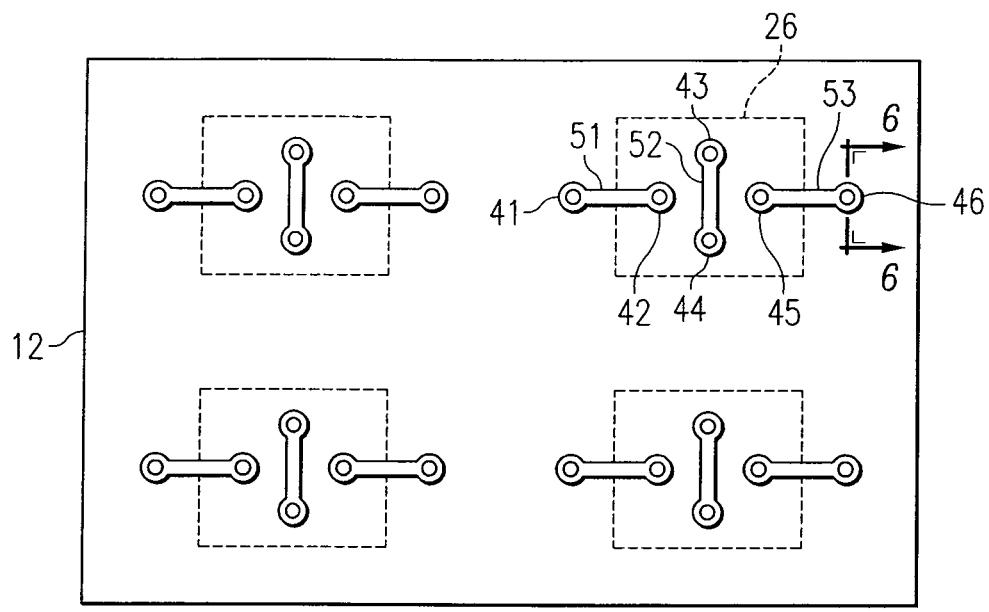
FIG. 4 is a diagrammatic top view of selected components from the assembly of FIG. 1, including a wafer.

FIG. 1 is a diagrammatic top view, with some structure cut away, of an apparatus in the form of an assembly 10 which embodies aspects of the present invention. FIG. 2 is a diagrammatic sectional side view of the assembly 10, taken along the section line 2-2 in FIG. 1. The assembly 10 includes a silicon wafer 12 which serves as a substrate, and includes a lid 14 which is bonded to the top of the wafer 12 in a manner described in more detail later. Although the wafer 12 is made of bulk silicon in the disclosed embodiment, it could alternatively be made of some other suitable material, such as alumina or glass. The wafer 12 has a top surface 11 (FIG. 2) and a bottom surface 13.

FIG. 3 is a diagrammatic bottom view of the lid 14. The lid 14 is a platelike part made of a glass material. A suitable glass material is available as part number USPG00006189 from U.S. Precision Glass of Santa Rosa, Calif. However, the lid 14 could alternatively be made from some other suitable material.

The lid 14 has four spaced rectangular recesses 16 in the underside thereof, arranged to form a two-by-two array. In the disclosed embodiment, the recesses 16 are formed in the lid 14 by carrying out a patterned etch of the lid 14 using known etching techniques. However, the recesses 16 could alternatively be formed in some other suitable manner, such as ultrasonic milling.

With reference to FIG. 3, the bottom surface of the lid 14 can be considered to include four annular surface portions which are each approximately rectangular, and which each extend completely around a respective one of the recesses 16. These annular surface portions on the bottom of the lid 14 each engage a respective one of four corresponding annular surface portions on the top surface of the wafer 12.

Each of the annular surface portions on the lid 14 is anodically bonded along its entire circumferential length to the corresponding annular surface portion on the wafer 12, using known techniques. The anodic bonding forms molecular bonds between the lid 14 and wafer 12, which fixedly secure the lid 14 to the wafer 12 in a manner forming a hermetic seal therebetween. There are a number of glass materials which will readily bond to silicon, for example those containing positive ions such as sodium or potassium. The particular glass material used for the lid 14 in the disclosed embodiment has been selected because it has a coefficient of thermal expansion (CTE) which is similar to the CTE of the silicon wafer 12. As a result, the wafer 12 and the lid 14 respond to temperature variations by expanding and contracting at substantially the same rate. This avoids expansion and contraction at different rates, which in turn avoids stresses that could disrupt the hermetic seal between the wafer and lid.

In the disclosed embodiment, the anodic bonding of the lid 14 to the wafer 12 is carried out in an atmosphere of inert gas, which may have a pressure less than atmospheric pressure. As a result, each of the four recesses 16 serves as a hermetically sealed chamber which is disposed between the lid 14 and wafer 12, and which contains an inert gas. Alternatively, the bonding could be carried out in a vacuum, so that the resulting chambers are each subject to a vacuum.

FIG. 4 is a diagrammatic top view of the wafer 12 with the lid 14 removed. With reference to FIGS. 1-2 and 4, four micro-electro-mechanical-systems (MEMS) 26 are formed on the top surface of the wafer 12. For clarity, each MEMS 26 is diagrammatically represented by broken lines in the drawings, in order to permit other structure to be visible. The four MEMS 26 are identical to each other, and are devices of a type known in the art. The four MEMS 26 are each disposed on the top surface of the substrate 12 at a location approximately centered within a respective one of the chambers defined by the respective recesses 16 in the lid 14.

Focusing on the MEMS 26 in the upper right portion of FIG. 4, this MEMS is associated with six vias 41-46 that each extend through the wafer 12 from the top surface 11 thereof (FIG. 2) to the bottom surface 13 thereof. Three gold traces 51-53 are formed on the top surface of the wafer 12. The trace 51 extends between and electrically couples the vias 41 and 42, the trace 52 extends between and electrically couples the vias 43 and 44, and the trace 53 extends between and electrically couples the vias 45 and 46. The MEMS 26 is electrically coupled to at least one of the traces 51-53, and/or at least one of the vias 41-46. Each of the other three MEMS 26 on the wafer 12 is associated with a further identical configuration of vias and traces. The configurations of vias and traces shown in FIG. 4 is merely exemplary, and a variety of other configurations could be used without departing from the present invention.

Figure 5:
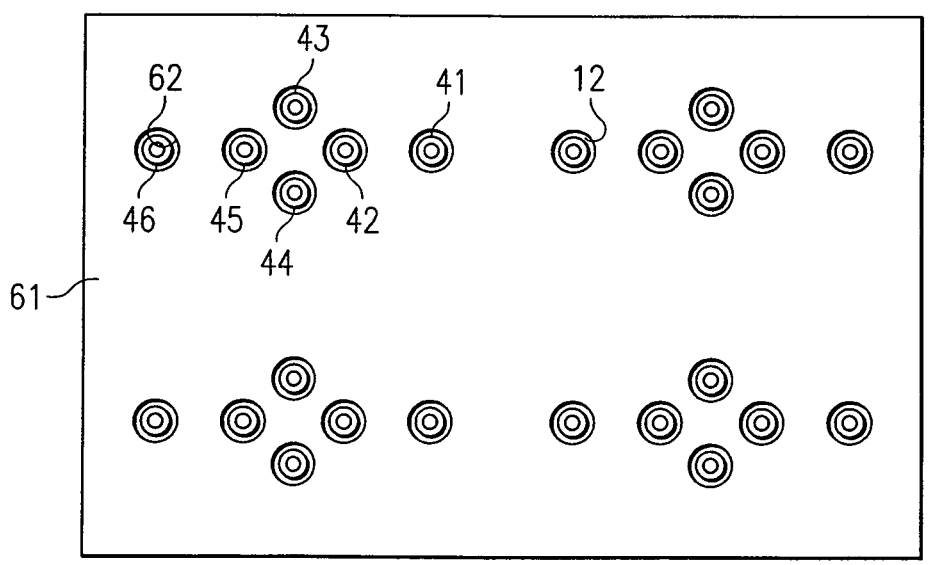
FIG. 5 is a diagrammatic bottom view of the wafer of FIGS. 1 and 5.

FIG. 5 is a diagrammatic bottom view of the wafer 12. A thin and electrically conductive ground plane 61 is provided on the bottom surface of the wafer 12, and has a plurality of circular openings therethrough, one of which is indicated at 62. The openings through the ground plane 61 have diameters which are greater than the diameters of the vias, and each of the vias has its lower end concentrically centered within a respective one of the openings to the ground plane 61.

Figure 6:
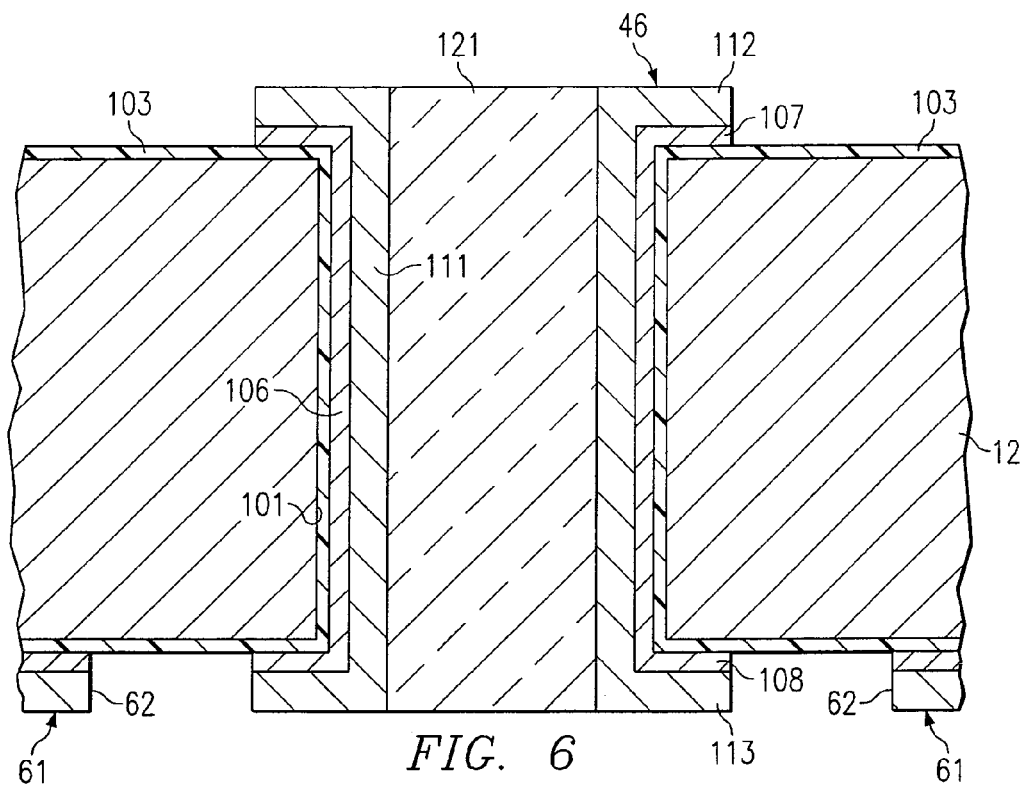
FIG. 6 is a diagrammatic sectional view taken along the section line 6-6 in FIG. 4.

FIG. 6 is a diagrammatic sectional view taken along the section line 6-6 in FIG. 4, and shows in greater detail the structure of the via 46. More specifically, the wafer 12 has an approximately cylindrical opening 101 extending vertically through it, in order to accommodate the via 46. The top and bottom surfaces of the wafer 12, and also the cylindrical surface of the opening 101, are covered with a layer 103 of thermal dioxide (silicon dioxide), which serves to electrically insulate the wafer 12 from electrically conductive portions of the via 46 and the ground plane 61.

The via 46 includes a sleevelike portion 106 which is disposed within the opening 101, and which has respective integral annular flange portions 107 and 108 projecting radially outwardly from the opposite ends thereof. In the disclosed embodiment, the portions 106-108 are made from titanium tungsten (TiW), but could alternatively be made from some other suitable material. The via 46 further includes a sleevelike portion 111, which is disposed concentrically within the sleevelike portion 106, and which has respective integral annular flange portions 112 and 113 projecting radially outwardly from the opposite ends thereof. In the disclosed embodiment, the portions 111-113 are made from gold, but could alternatively be made from some other suitable material. The flange portions 112 and 113 serve as contacts or pads which can be used to electrically couple other structure to the via 46. For example, the trace 53 in FIG. 4 is electrically coupled to the flange portion 112, and to an outer end of the flange portion 107. A not-illustrated external circuit can be coupled to the flange portion 113. To such an external circuit, the vias each appear electrically to be a 50-ohm line.

The via 46 also includes, concentrically disposed within the sleevelike portion 111, a cylindrical core 121 made of a glass material. The ends of the glass core 121 are approximately flush with the outer ends of the flange portions 112-113, or may be concave and/or recessed slightly with respect to the outer ends of the flange portions 112-113. In the disclosed embodiment, the glass core 121 is made from a glass material commercially available under catalog number 4035-B from Electro-Science Laboratories, Inc. of King of Prussia, Pa. However, the cores 121 could alternatively be made from some other suitable material.

The via 46 hermetically seals the opening 101 through the wafer 12. In the disclosed embodiment, the structure of the via 46 provides a hermetic seal value of 1.0E10-8 cubic centimeters of helium per second with respect to air on one side of the wafer at room temperature and atmospheric pressure, and a vacuum on the other side of the wafer. In order to facilitate this hermetic seal, the material used for the glass core 121 has been selected so that it has a CTE which is similar to the CTE of the silicon wafer 12. As a result, the wafer 12 and the core 121 respond to temperature variations by expanding and contracting at substantially the same rate. This avoids expansion and contraction at different rates, which in turn avoids stresses that could disrupt the hermetic seal by producing cracks or separations within the via 46.

Referring again to FIG. 1, when fabrication of the assembly 10 has been completed, it can be cut into four sub-assemblies which are all identical, in particular by cutting the assembly 10 along each of the two broken lines 141 and 142 in FIGS. 1 and 4. This cutting of the assembly 10 can be carried out using a diamond wheel saw of a known type, or using some other suitable technique. Although the assembly 10 in the disclosed embodiment is configured to be cut into four-identical sub-assemblies, it will be recognized that the wafer 12 and lid 14 could be substantially larger and could include a much larger number of identical sub-assemblies.

Figure 8:
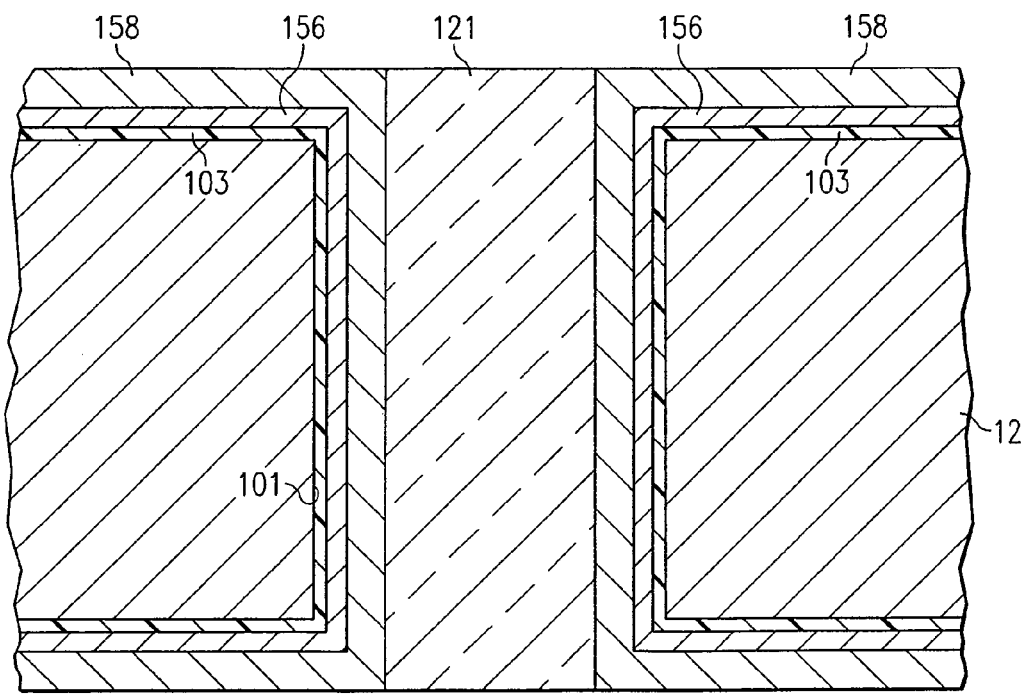
FIG. 8 is a diagrammatic sectional view similar to FIG. 6, but showing a portion of the assembly at an earlier stage during its fabrication.
Figure 7:
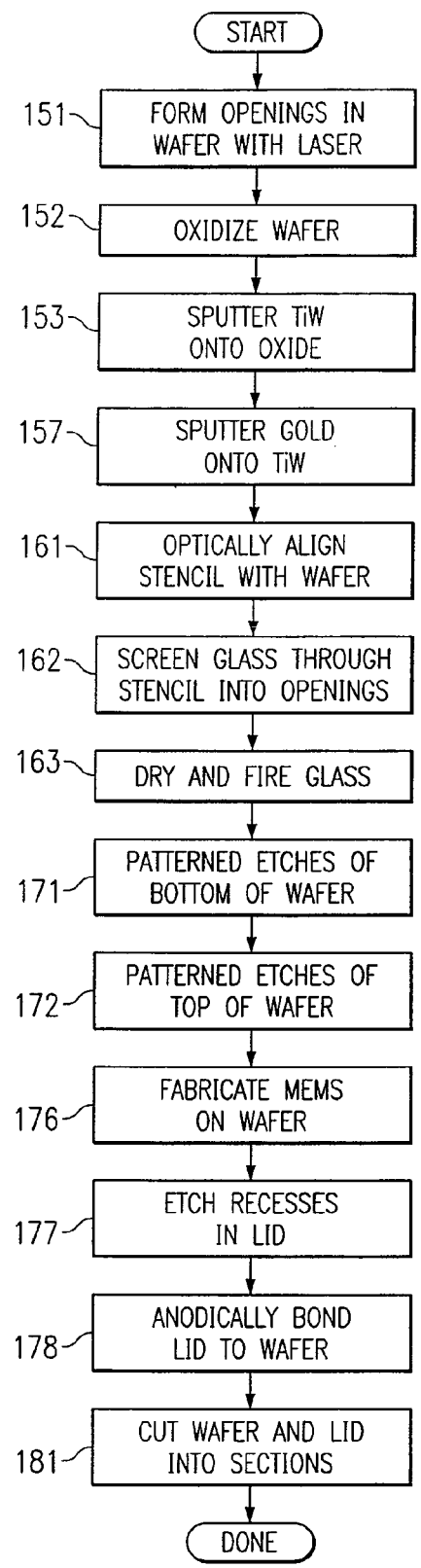
FIG. 7 is a flowchart showing a sequence of steps used to fabricate the assembly shown in FIGS. 1-2.

FIG. 7 is a flowchart showing a sequence of steps which can be carried out in order to fabricate the assembly 10 of FIG. 1. FIG. 8 is a diagrammatic sectional view similar to FIG. 6, but showing the assembly at an intermediate stage during its fabrication.

With reference to block 151 in FIG. 7, fabrication of the assembly begins with the wafer 12, which will serve as the substrate. A laser is used to form a number of via openings through the wafer 12 at predetermined locations, one example of which is the via opening shown at 101 in FIG. 8. In the disclosed embodiment, the wafer 12 has a thickness of approximately 533 μm, and the via openings 101 each have a diameter in the range of approximately 153 to 250 μm. Thus, the ratio of the thickness of the wafer to the diameter of the openings is approximately 2:1. Careful use of a laser to create the via openings ensures that the wafer will have no surface damage near the openings for the vias, and that the openings themselves will have surfaces which are perpendicular to the top and bottom surfaces of the wafer, with no internal damage.

Next, with reference to block 152 in FIG. 7, the wafer 12 is heated in an atmosphere which contains oxygen, so that all exposed surfaces of the wafer will grow the layer of thermal oxide which is shown at 103 in FIG. 8. Since the wafer 12 in the disclosed embodiment is silicon, the layer 103 is silicon dioxide. The portion of the layer 103 within the opening 101 will serve to isolate the silicon of the wafer 12 from the conductive via which will be formed within the opening 101. As discussed above, the primary conductive material in the vias is gold. The oxide layer 103 helps to ensure that, when the gold part of the via is subsequently formed, the gold does not diffuse into the silicon of the wafer 12. The presence of gold in the silicon would cause changes in the resistivity and dielectric constant of the wafer 12, which in turn would change its electrical performance.

With reference to block 153 in FIG. 7, the next step is to sputter titanium tungsten (TiW) onto the wafer 12 from both sides thereof, so as to ensure that TiW completely covers the surfaces within the openings for the vias, as well as the top and bottom surfaces of the wafer. This results in the layer of TiW which is shown at 156 in FIG. 8. In the disclosed embodiment, the TiW layer 156 has a thickness on the order of approximately 0.05 to 0.06 μm, but could alternatively have some other suitable thickness. The TiW layer 156 helps to further isolate the vias and resist diffusion of gold into the silicon material of the wafer 12.

Next, with reference to block 157 in FIG. 7, gold is sputtered onto the wafer from both sides thereof, so as to form a gold layer which is shown at 158 in FIG. 8. The gold layer 158 completely covers the TiW layer 156, on both sides of the wafer and within each opening through the wafer. In the disclosed embodiment, the gold layer 158 has a thickness on the order of approximately 3.0 μm, but could alternatively have some other suitable thickness.

With reference to block 161 in FIG. 7, a stencil is then applied to one side of the wafer, and is optically aligned with the wafer using known techniques. The stencil has through it a plurality of openings of appropriate diameter, which are each aligned with a respective one of the openings through the wafer.

Next, with reference to block 162 in FIG. 7, a glass material of the type discussed earlier is screened through the stencil and into each of the openings through the wafer, in order to form in each opening a glass core of the type shown at 121 in FIG. 8. As the glass is being introduced into the openings in the wafer, the metalization 156 and 158 on the top surface helps to protect the oxide layer 103, for example from damage by the stencil. Care must be taken to avoid applying the glass material to the top or bottom surfaces of the wafer, for example by ensuring cleanliness of the screen, and by effecting careful optical alignment of the stencil before the glass material is screened through it. If glass material is applied to the metalization at locations on the top or bottom surfaces of the wafer, it may interfere with subsequent removal of the metalization at those locations. The amount of glass material screened into each opening is such that the ends of the glass material in each opening are approximately flush with the outer surfaces of the gold layer 158, or are concave or slightly recessed in relation to the outer surfaces of the gold layer. Convex or outwardly projecting ends on the glass cores are avoided, or are corrected.

With reference to block 163 in FIG. 7, the glass cores 121 are dried, and are then fired. In the disclosed embodiment, the cores are fired at 525° C., but it would alternatively be possible to use some other temperature, for example where a different glass material was selected for use. At this point in the fabrication process, the assembly appears as shown in FIG. 8. The materials within the opening 101 provide a hermetic seal value between opposite sides of the wafer 12 of at least 1.0E10-8 cubic centimeters of helium per second for air on one side of the wafer at room temperature and atmospheric pressure, and a vacuum on the other side of the wafer.

Next, with reference to block 171 in FIG. 7, two successive etches are carried out with the same basic pattern on the bottom surface of the assembly using known techniques, in order to remove selected portions of the TiW and gold layers 156 and 158. The first etch removes gold, and the second etch removes TiW. The pattern used for both etches is configured to form an annular groove or recess around the lower end of each via. These annular recesses serve as the openings 62, which were discussed above in association with FIGS. 5 and 6. After these etches, the layers 156 and 158 have portions that remain on the bottom of the wafer 12 and serve as the ground plane 61 (FIGS. 5 and 6), and other remaining portions that serve as the annular flanges 108 and 113 (FIG. 6).

Next, with reference to block 172 in FIG. 7, a gold etch and a TiW etch are successively carried out with the same basic pattern on the top side of the wafer, in order to selectively remove all of the material of the layers 156 and 158, except for an annular portion extending around the upper end of each via, and portions which will serve as traces or runs. In other words, the portions of the layers 156 and 158 which remain on top of the wafer serve as the annular flanges 107 and 112 (FIG. 6) at the upper end of each via, and as the traces 51-53 (FIG. 4) that extend between vias.

It will be recognized that, after the etching steps set forth in blocks 171 and 172 of FIG. 7, the portions of TiW layer 156 (FIG. 8) which remain in the assembly serve as the sleevelike portion 106 (FIG. 6), the annular flanges 107 and 108, a bottom layer of the traces 51-53, and a bottom layer of the conductive ground plane 61. Similarly, the portions of the gold layer 158 (FIG. 8) which remain in the assembly serve as the sleevelike portion 111 (FIG. 6), the annular flanges 107 and 108, a top layer of the traces 51-53, and the top layer of the conductive ground plane 161.

As discussed above, the traces 51-53 in the disclosed embodiment are formed by the etching step of block 172. However, it will be recognized that it would alternatively be possible for this etching step to remove the material of the TiW layer 156 and the gold layer 158 in the region where the traces 51-53 are to be formed, and for the traces 51-53 to be fabricated at a later point in time, during fabrication of the MEMS devices 26.

Referring now to block 176 in FIG. 7, the next step is to fabricate a plurality of the MEMS devices 26 on top of the developing assembly. The MEMS devices 26, and the techniques for making them, are known in the art, and are therefore not described here in detail.

With reference to block 177 in FIG. 7, a sheet of glass material which will serve as the lid 14 is subjected to chemical etching of a known type, in order to form in a bottom surface thereof a plurality of the recesses 16 (FIGS. 2-3). The recesses 16 could alternatively be formed by some other technique such as ultrasonic milling. The chemical etching approach used in the disclosed embodiment produces a lid which, after it is bonded to the wafer, provides a clear view of the structure beneath it. In contrast, if the recesses are formed by the alternative technique of ultrasonic milling, the surfaces within each recess have a fritted appearance, which tends to obscure a clear view of structure located below the lid.

Next, with reference to block 178 in FIG. 7, and with the lid and wafer disposed within an atmosphere of inert gas, the lid is placed on the wafer in proper alignment with the wafer, and then the engaging surfaces of the lid and wafer are anodically bonded to each other using known techniques of anodic bonding, in order to form a hermetic seal between the lid and wafer. Instead of an atmosphere of an inert gas, the bonding could alternatively be carried out with the lid and wafer disposed in a vacuum.

As discussed above, the disclosed embodiment uses bulk silicon as the material of the wafer 12, but a possible alternative material is alumina. In the event that alumina is used for the wafer, a further processing step is needed. In particular, a grid of silicon strips is formed on the surface of the wafer in the regions where the glass lid is to be bonded to the wafer, and the glass lid is then bonded to the silicon strips using anodic bonding. This grid of silicon strips would be formed after the vias have been completed, and prior to fabrication of the MEMS devices.

At this point in the fabrication procedure, the assembly will appear as shown at 10 in FIGS. 1 and 2. With reference to block 181 in FIG. 7, this the assembly 10 can then be cut along the lines indicated at 141 and 142 in FIG. 1, in order to separate the assembly 10 into four identical sub-assemblies. In the disclosed embodiment, a diamond wheel saw of a known type is used to cut up the assembly 10, but it would alternatively be possible to use some other suitable technique to cut up the assembly 10.

As mentioned above, the assembly 10 of the disclosed embodiment includes only four identical sub-assemblies, for the sake of simplicity in explaining the present invention. However, the assembly 10 could alternatively include a much larger number of identical sub-assemblies.

The present invention provides a number of technical advantages. One such technical advantage is that a substrate or wafer on which MEMS devices are built serves as an integral part of a hermetically sealed package for the devices. A related advantage is that vias provided through the substrate permit electrical communication with the device, while also maintaining a hermetic seal of a suitable level. Still another related advantage is that the vias are configured to have a very low loss factor, such as 0.1 dB or less. As to those vias which carry radio frequency (RF) signals, the structure of the vias provides isolation from transient or stray inductance which could degrade the RF performance. Another advantage is that the vias provide the ability to use either ball bonding to the vias, or a ball grid array, to reliably effect electrical coupling of the hermetically sealed package to the next level of the system.

Still another advantage relates to the fact that a hermetic package is formed primarily by the substrate and a lid which is bonded to the substrate, providing a low cost, lightweight and reliable package. The lid is secured to the wafer in a manner which in not detrimental to the operation of the devices being packaged. A related advantage is that this packaging can be carried out at the wafer level, with the wafer being subsequently cut into smaller pieces. This is particularly advantageous in a situation where the device in each package is a MEMS device capable of RF operation. Still another advantage is that the package has a chamber which contains the MEMS device, and which also contains an inert gas or a vacuum that facilitates safe operation of the MEMS device.

Although one embodiment has been illustrated and described in detail, it will be understood that various substitutions and alterations are possible without departing from the spirit and scope of the present invention, as defined by the following claims.

What is claimed is:

1. A method comprising:
   providing a wafer comprisng:
      a first side;
      a second side;
      a plurality of sections disposed on the first side; and
      a plurality of first annular surface portions disposed on a respective one of the plurality of sections;
   forming a plurality of spaced structures on the first side of the wafer in a manner so that each of the structures is on a respective one of the sections, and so that each of the first annular surface portions extends around a respective one of the spaced structures;
   providing a cover, the cover having on one side thereof a plurality of second annular surface portions which are each engageable with a respective one of the first annular surface portions;
   bonding each of the first annular surface portions to a respective one of the second annular surface portions to create a plurality of hermetically sealed chambers between the wafer and the cover, each hermetically sealed chamber having therein a respective one of the structures;
   creating an opening through the wafer that extends from the first side to the second side; and
   forming a via within the opening, the via operable to provide a hermetic seal within the opening with respect to the first and second sides of the wafer, the via comprising:
      a first end adjacent to the first side of the wafer;
      a second end adjacent to the second side of the wafer;
      a conductive portion operable to provide electrical conductivity between the first end and the second end;
   forming a sleevelike portion with an electrically conductive material within the via; and
   forming an electrically non-conductive core portion within the sleevelike portion.

2. The method of claim 1, wherein forming the plurality of spaced structures comprises electrically coupling one of the spaced structure to the first end of the conductive portion of the via.

3. The method of claim 1, further comprising cutting the wafer and cover into a plurality of portions, each portion comprising:
   a respective one of the sections of the wafer;

a respective one of the structures;

a respective one of the first annular surface portions; and a respective one of the second annular surface portions.

4. The method of claim 1, wherein forming the sleevelike portion comprises:

forming an outer sleeve comprising titanium tungsten; and thereafter forming within the outer sleeve an inner sleeve comprising gold.

5. The method of claim 1, wherein the non-conductive core portion comprises a glass material.

6. The method of claim 1, further comprising forming on the second side of the wafer a conductive ground layer having an opening therethrough with a size greater than a size of the second end of the via, the second end of the via being positioned within the opening through the ground layer in a manner so that the conductive portion of the via is free of contact with the ground layer.

7. The method of claim 1, wherein the cover comprises a glass material.

8. The method of claim 1, wherein providing the cover comprises forming a plurality of recesses in a side of the cover facing the substrate, the plurality of recesses forming a respective one of the chambers, each of the second annular surface portions extending around one of the respective recesses.

9. The method of claim 1, wherein the plurality of spaced structures comprises a plurality of micro-electro-mechanical systems.

* * * * *